US010274214B2

(12) United States Patent
Otsuka et al.

(10) Patent No.: US 10,274,214 B2
(45) Date of Patent: Apr. 30, 2019

(54) STORAGE FACILITY

(71) Applicant: Daifuku Co., Ltd., Osaka-shi (JP)

(72) Inventors: Hiroshi Otsuka, Gamo-gun (JP); Shinsuke Kawamura, Gamo-gun (JP); Tadahiro Yoshimoto, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 879 days.

(21) Appl. No.: 14/310,325

(22) Filed: Jun. 20, 2014

(65) Prior Publication Data

US 2015/0004899 A1 Jan. 1, 2015

(30) Foreign Application Priority Data

Jun. 26, 2013 (JP) ................. 2013-134268

(51) Int. Cl.
*F24F 3/16* (2006.01)
*H01L 21/67* (2006.01)
*H01L 21/677* (2006.01)

(52) U.S. Cl.
CPC ........ *F24F 3/161* (2013.01); *H01L 21/67017* (2013.01); *H01L 21/67769* (2013.01)

(58) Field of Classification Search
CPC ............... F24F 3/161; H01L 21/67017; H01L 21/67769
USPC ....................................................... 454/341
See application file for complete search history.

(56) References Cited

U.S. PATENT DOCUMENTS

| 5,997,398 A | 12/1999 | Yamada et al. |
| 6,123,120 A | 9/2000 | Yotsumoto et al. |
| 6,251,155 B1 * | 6/2001 | Fukushima ............ B01D 46/00 454/187 |
| 2002/0055329 A1 * | 5/2002 | Storck, Jr. ................. F24F 7/06 454/186 |
| 2003/0009904 A1 | 1/2003 | Tokunaga |
| 2004/0152322 A1 * | 8/2004 | Tokunaga ......... H01L 21/67017 438/689 |
| 2008/0134483 A1 * | 6/2008 | Aburatani ......... H01L 21/67766 29/25.01 |

(Continued)

FOREIGN PATENT DOCUMENTS

| JP | 7133004 A | 5/1995 |
| JP | 1179318 A | 3/1999 |
| JP | 11168135 A | 6/1999 |

(Continued)

*Primary Examiner* — Steven B McAllister
*Assistant Examiner* — Allen R Schult
(74) *Attorney, Agent, or Firm* — The Webb Law Firm

(57) ABSTRACT

A storage facility is achieved that is capable of suppressing, with a simple configuration, the inactive gas concentration in the gas discharged to the outside of a storage space. The storage facility includes a storage device including a plurality of storage sections in an inside of a storage space formed so as to be partitioned from the outside, and an inactive gas supply portion that supplies inactive gas to an inside of a container stored in the storage section. The storage device includes a gas discharge portion that discharges, to the outside of the storage space, gas within the storage space that contains the gas discharged from the container. The gas discharge portion includes a restricting orifice portion serving as a restricting portion that restricts a flow rate of gas, and the restricting orifice portion is formed below a region where the storage sections are disposed.

10 Claims, 5 Drawing Sheets

(56) References Cited

U.S. PATENT DOCUMENTS

2009/0245985 A1 10/2009 Matsuba
2013/0122799 A1* 5/2013 Maherault ......... H01L 21/67017
454/254

FOREIGN PATENT DOCUMENTS

| JP | 2001338971 | A | 12/2001 |
| JP | 200392345 | A | 3/2003 |
| JP | 2004269214 | A | 9/2004 |
| JP | 2006327773 | A | 12/2006 |
| JP | 2009249053 | A | 10/2009 |
| TW | 287297 | B | 10/1996 |

* cited by examiner

STORAGE FACILITY

CROSS-REFERENCE TO RELATED APPLICATION

This application claims priority to Japanese Patent Application No. 2013-134268 filed Jun. 26, 2013, the disclosure of which is hereby incorporated in its entirety by reference.

FIELD OF THE INVENTION

The present invention relates to a storage facility including a storage device that includes a plurality of storage sections in the inside of a storage space formed so as to be partitioned from the outside and an inactive gas supply portion that supplies inactive gas to the inside of a container stored in the storage section.

BACKGROUND

JP 11-168135A discloses an example of the storage facility as described above. Paragraphs 0101 to 0118 of JP 11-168135A describe a technique for supplying inactive gas to the inside of the container stored in the storage section of the storage device so as to replace the gas within the container with the inactive gas, thereby keeping the oxygen and water vapor concentrations in the inside of the container low. Additionally, Paragraph 0103 of JP 11-168135A describes the use of a pipe connected to the cover portion of the container as an exhaust port for discharging the gas within the container at the time of replacing the gas within the container with the inactive gas.

SUMMARY OF THE INVENTION

At the time of replacing the gas within the container with inactive gas as described above, the gas within the container that contains the inactive gas supplied by the inactive gas supply portion is discharged to the outside of the container. In other words, the gas that is discharged from the container contains higher concentration inactive gas than in the air, and the oxygen concentration of the gas discharged from the container decreases as the inactive gas concentration increases. Thus, it is not preferable that the gas discharged from the container is directly discharged to the outside of the storage space. The reason is that when the gas having a high inactive gas concentration is discharged to the outside of the storage space, it may be necessary to restrict the range of movement of an operator around the storage device, or stop the supply of the inactive gas to the inside of the container during an operation performed by the operator. However, JP 11-168135A has not particularly recognized this problem.

Therefore, there is a need to achieve a storage facility capable of suppressing, with a simple configuration, the inactive gas concentration in the gas that is discharged to the outside of the storage space.

A storage facility according to the present invention includes a storage device including a plurality of storage sections in an inside of a storage space formed so as to be partitioned from the outside, and an inactive gas supply portion that supplies inactive gas to an inside of a container stored in the storage section, wherein the storage device includes a gas discharge portion that discharges, to the outside of the storage space, gas within the storage space that contains the gas discharged from the container, the gas discharge portion includes a restricting orifice portion serving as a restricting portion that restricts a flow rate of gas, and the restricting orifice portion is formed below a region where the storage sections are disposed.

With this configuration, the gas discharge portion is configured to discharge, to the outside of the storage space, the gas within the storage space that contains the gas discharged from the container, and it is therefore possible to discharge the gas discharged from the container to the outside of the storage space after mixing the gas with the gas within the storage space. At this time, since the gas discharge portion includes the restricting orifice portion serving as a restricting portion, the mixing of gases in the inside of the storage space can be more promoted than in the case where the restricting orifice portion is not included. That is, with a simple configuration achieved by the provision of the restricting orifice portion, the gas discharged from the container and the gas within the storage space can be appropriately mixed by utilizing the storage space. As a result, it is possible to suppress the inactive gas concentration in the gas discharged to the outside of the storage space.

Furthermore, with this configuration, the restricting orifice portion is formed below the region where the storage sections are disposed, and therefore, the location where the gas is discharged by the gas discharge portion can be formed at a position close to the floor portion. Accordingly, for example, when the storage facility is installed in a down flow-type clean room, it is possible, by utilizing a downflow, to cause the gas discharged by the gas discharge portion to the outside of the storage space to flow to the air circulation path of the clean room, while inhibiting the gas from moving up from the floor portion. As a result, it is possible to suppress the inactive gas concentration in the work space that is formed above the floor portion.

Moreover, in general, the height of the storage section that is disposed at the lowermost portion is set to a position higher than the floor portion due to the constraints, including, for example, the structure of an internal transfer device that transports containers in the inside of the storage space. With this configuration, the restricting orifice portion is formed below the region where the storage sections are disposed. Accordingly, when a space is formed between the lowermost storage section and the floor portion, that space can be effectively used to provide the gas discharge portion.

Examples of preferred embodiments of the present invention will be described below.

In an embodiment of the storage facility according to the present invention, it is preferable that the storage device includes a communicating space below the region where the storage sections are disposed in the inside of the storage space, the communicating space being in communication with said region via the restricting orifice portion, and the gas discharge portion includes an external communicating portion that communicates the communicating space with the outside of the storage space.

With this configuration, gases can be mixed also in the communicating space, and it is therefore possible to further suppress the inactive gas concentration in the gas that is discharged to the outside of the storage space.

In an embodiment of the storage facility according to the present invention, it is preferable that a controller that controls an operation of the storage device is disposed in the communicating space.

With this configuration, the space in which the controller is disposed can be utilized to form the communicating space, and it is therefore possible to appropriately provide the gas discharge portion, while suppressing an increase in the size of the installation space for the facility.

In an embodiment of the storage facility according to the present invention, it is preferable that the restricting orifice portion and the external communicating portion are disposed in different positions relative to each other in a direction orthogonal to both a vertical direction and an opening direction of the restricting orifice portion.

With this configuration, it is possible to achieve a more complex gas flow path from the restricting orifice portion to the external communicating portion in the communicating space than when the restricting orifice portion and the external communicating portion are disposed at the same position in a direction orthogonal to both the vertical direction and the opening direction of the restricting orifice portion. Accordingly, it is possible to promote the mixing of gases in the communicating space.

In an embodiment of the storage facility according to the present invention, it is preferable that the storage device includes a discharge promoting portion that promotes discharge of gas by the gas discharge portion.

With this configuration, the discharge of gas by the gas discharge portion is promoted. Accordingly, even if a portion where the inside and the outside of the storage space are in communication without passing through the gas discharge portion is formed, it is possible to inhibit the gas within the storage space from flowing out to the outside of the storage space through that portion. Accordingly, it is possible to inhibit gas having a high inactive gas concentration from being discharged to the outside of the storage space.

In an embodiment of the storage facility according to the present invention, it is preferable that, in the above-described configuration in which the storage device includes the discharge promoting portion, the gas discharge portion includes a fan that blows air toward the outside of the storage space, and the discharge promoting portion is constituted by the fan.

With this configuration, the gas within the storage space can be sucked from the gas discharge portion side, and it is therefore possible to easily achieve the gas discharge promoting effect of the discharge promoting portion as compared with the case where an air flow is actively formed from the storage space side so as to guide the gas within the storage space to the gas discharge portion.

In an embodiment of the storage facility according to the present invention, it is preferable that the inactive gas supply portion is configured to supply inactive gas to an inside of a container stored in a target storage section included in the plurality of the storage sections, a plurality of the target storage sections are disposed along an arrangement direction along a horizontal plane, and at least a part of the restricting orifice portion is disposed at a different position in the arrangement direction from the target storage sections.

With this configuration, the distance between the target storage section and the restricting orifice portion can be increased as compared with the case where the restricting orifice portion does not have a part that is disposed at a different position in the arrangement direction from the target storage section. Accordingly, it is possible to promote the mixing of gases in the inside of the storage space by that increase.

In an embodiment of the storage facility according to the present invention, it is preferable that the storage device includes a limiting portion that limits, below the region where the storage sections are disposed, discharge of gas that does not pass through the gas discharge portion to the outside of the storage space.

Since the restricting orifice portion is formed below the region where the storage sections are disposed, the flow rate of gas is restricted by the restricting orifice portion in a region below the region where the storage sections are disposed, so that the outflow of gas to the outside of the storage space via a gap or the like is more likely to occur. In view of this fact, with this configuration, the outflow of gas that does not pass through the gas discharge portion to the outside of the storage space can be limited by the limiting portion in the region below the region where the storage sections are disposed. Accordingly, it is possible to inhibit gas having a high inactive gas concentration from being discharged to the outside of the storage space.

DETAILED DESCRIPTION

A storage facility according to an embodiment of the present invention will be described with reference to the drawings. Here, a description will be given of a case where a storage facility according to the present invention is applied to a storage facility 1 installed in a clean room as shown in FIG. 1.

1. Overall Configuration of Storage Facility

Figure 1:
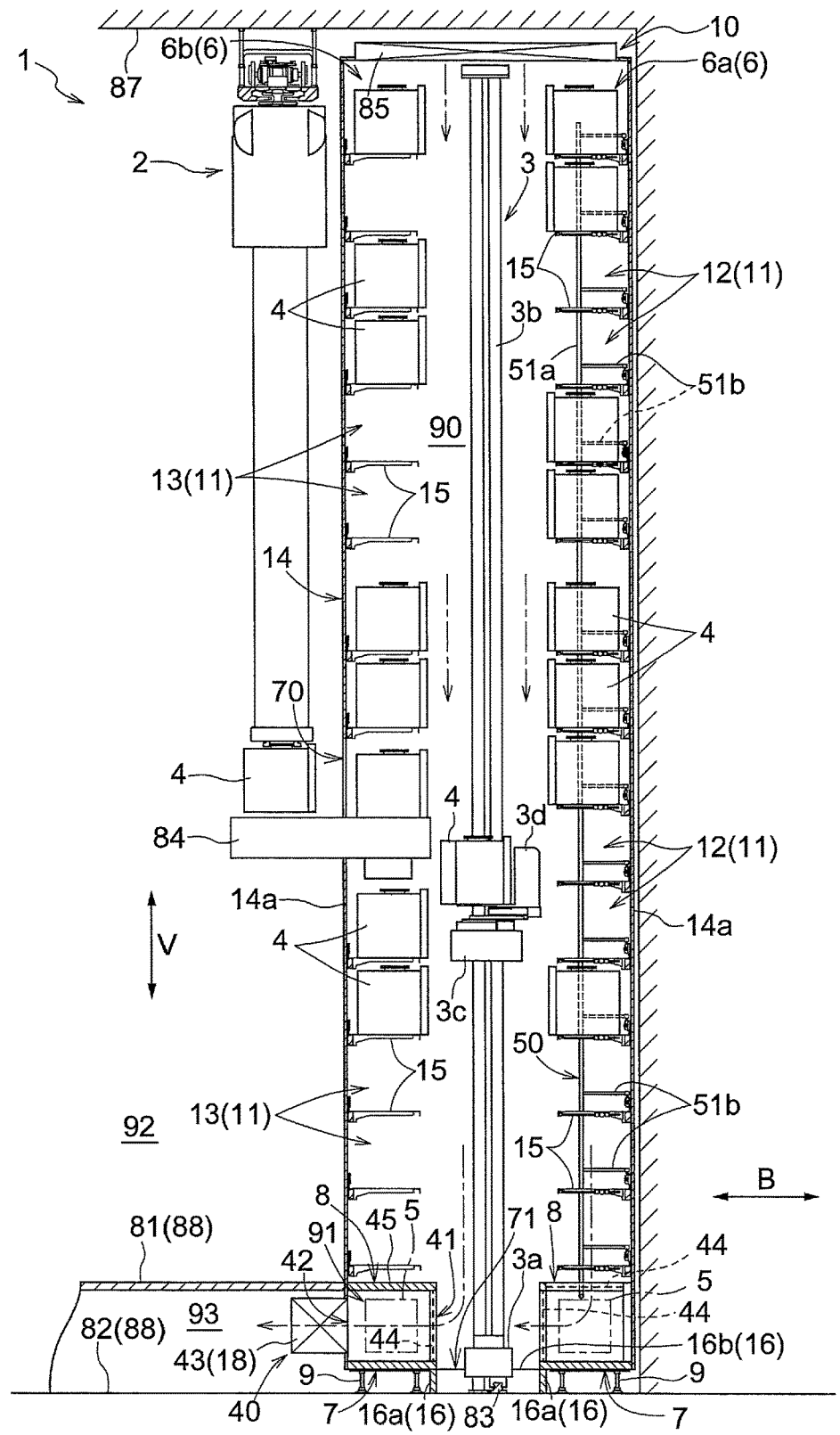
FIG. 1 is a cross-sectional view of a storage facility according to an embodiment of the present invention.

As shown in FIG. 1, the storage facility 1 includes a storage device 10 and an inactive gas supply portion 50. The storage device 10 is a device that stores containers 4, and includes a plurality of storage sections 11 that store containers 4. Also, inactive gas is supplied by the inactive gas supply portion 50 to the inside of the container 4 stored in the storage section 11. The details of the storage device 10 and the inactive gas supply portion 50 will be described later.

In the present embodiment, each of the containers 4 is a container whose inside space can be air-tightly sealed. In the inside of the container 4, a semiconductor substrate or a reticle substrate can be contained, for example. In the present embodiment, the container 4 includes a body portion and a cover portion that is detachable from the body portion, and is configured such that the inside space of the container 4 can be air-tightly sealed in a state in which the cover portion is attached to the body portion. In the present embodiment, an air-tight container made of synthetic resin that is compliant with the SEMI (Semiconductor Equipment and Materials International) standard is used as the container 4. Specifically, a FOUP (Front Opening Unified Pod) is used.

In the present embodiment, the storage facility 1 further includes an external transport device 2 as shown in FIG. 1. In the present embodiment, the external transport device 2 is a hoist-type guided vehicle that travels along a rail provided on a ceiling portion 87. The external transport device 2 transports a container 4 while holding a flange portion formed on the top surface of the container 4. As shown in FIG. 1, the storage facility 1 includes a moving device 84 that moves the container 4 between the inside and the outside of the storage device 10. Note that the inside of the storage device 10 means the inside of a storage space 90, which will be described below, and the outside of the storage device 10 means the outside of a storage space 90, which will be described below. In the present embodiment, the moving device 84 is constituted by a conveyor.

The moving device 84 is provided so as to penetrate a wall member 14 of the storage device 10. More specifically, an opening portion 70 is formed in the wall member 14 at a position at which the moving device 84 is provided. The moving device 84 moves the container 4 between an external transfer position located in the outside of the storage device 10 and an internal transfer position located in the inside of the storage device 10. Also, the transfer of the container 4 between the external transport device 2 and the moving device 84 is performed at the external transfer position, and the transfer of the container 4 between an internal transport device 3, which will be described below, and the moving device 84 is performed at the internal transfer position. In other words, the external transport device 2 is configured to pass the container 4 that is to be stored in the storage device 10 to the moving device 84 at the external transfer position, and to receive the container 4 that is to be retrieved from the storage device 10 from the moving device 84 at the external transfer position. The container 4 that has been passed to the moving device 84 from the external transport device 2 is transported to the inside of the storage device 10 by the moving device 84, and thereafter transported to the storage section 11 by the internal transport device 3. The container 4 that has been transported from the storage section 11 to the moving device 84 by the internal transport device 3 is transported to the outside of the storage device 10 by the moving device 84, and thereafter received by the external transport device 2.

In the present embodiment, the storage facility 1 is installed in a down flow-type clean room in which clean air flows downward from the ceiling side to the floor side. A floor portion 88 of the clean room is made up of a lower floor 82 and an upper floor 81 that is provided above the lower floor 82. A work space 92 is formed between the upper floor 81 and the ceiling portion 87, and an underfloor space 93 is formed between the upper floor 81 and the lower floor 82. The upper floor 81 is a grating floor in which a plurality of ventilation holes penetrating therethrough in an up-down direction V (the thickness direction) are formed. The lower floor 82 is a floor having no ventilation hole, and is constituted by non-porous concrete in the present embodiment.

The air that has flowed from the ceiling portion 87 to the floor portion 88 flows to the underfloor space 93 via the upper floor 81, and is thereafter supplied to the ceiling portion 87 via a connection path (not shown) provided outside the work space 92. The air that has been supplied to the ceiling portion 87 is blown out downward from a discharge outlet (not shown) provided in the ceiling portion 87. Thus, the air within the clean room is circulated. Although the details are omitted, the air that has flowed from the underfloor space 93 to the connection path is cleaned by an air filter or the like provided on the path to the discharge outlet of the ceiling portion 87.

Figure 4:
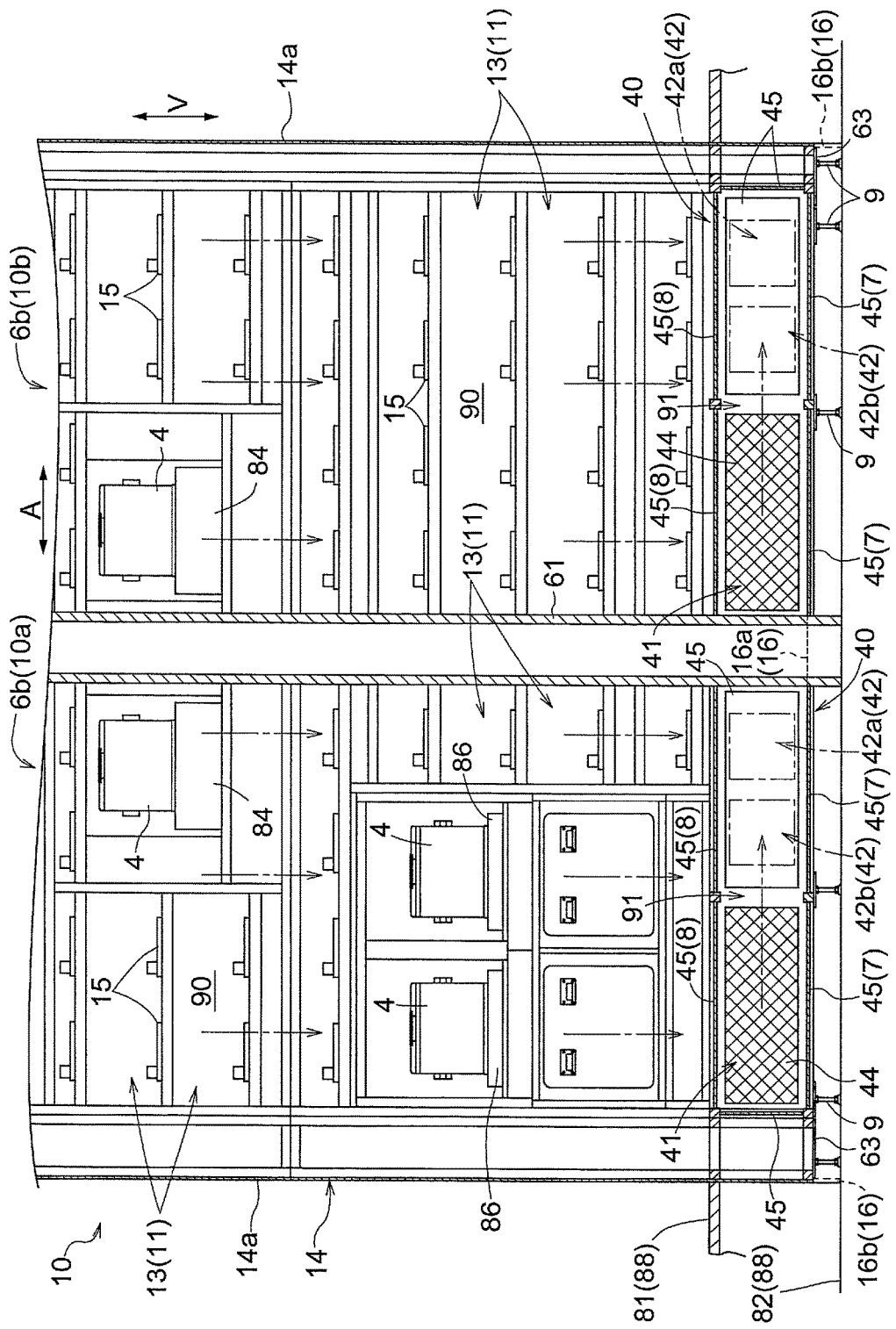
FIG. 4 is a cross-sectional view taken along the arrows IV-IV in FIG. 3.

An operator in the clean room performs an operation (e.g., a maintenance operation or the like) while standing, for example, on the upper floor 81 in the inside of the work space 92. In the present embodiment, the operations performed by the operator in the inside of the work space 92 include the storage and retrieval operation of the container 4 in and from the storage device 10. As shown in FIG. 4, the storage device 10 includes placement devices 86 that are used by the operator when performing the storage and retrieval operation of the containers 4 to and from the storage device 10. Although not shown, at a position of the wall member 14 at which each placement device 86 is provided, an operator opening portion for the operator to pass the container 4 therethrough and an opening/closing member (e.g., a shutter or the like) for opening/closing the operator opening portion are provided. The opening/closing member is basically switched to the same closed state, and is configured to air-tightly close the operator opening portion in the closed state. At the time of storing the container 4 in the storage device 10, or in other words, passing the container 4 to the placement device 86, the operator operates the opening/closing member to open, and thereafter moves the container 4 from the outside of the storage device 10 to the inside thereof via the operator opening portion. At the time of retrieving the container 4 from the storage device 10, or in other words, receiving the container 4 from the placement device 86, the operator operates the opening/closing member to open, and thereafter moves the container 4 from the inside of the storage device 10 to the outside thereof via the operator opening portion.

It is also possible to adopt a configuration in which the placement device 86 includes a conveyor provided so as to penetrate the operator opening portion, and the transfer of the container 4 between the operator and the placement device 86 is performed at a portion of the conveyor that is located in the outside of the storage device 10. In this case, the opening/closing member for opening/closing the operator opening portion may not be provided, and the operator opening portion may be constantly open.

In the present embodiment, the storage device 10 includes a plurality of moving devices 84 and a plurality of placement devices 86 as shown in FIG. 4. Specifically, the storage device 10 includes two moving devices 84 and two placement devices 86. When a plurality of moving devices 84 are provided in this way, a part of the moving devices 84 may be used as the moving device(s) for storage, and another part of the moving devices 84 may be used as the moving device(s) for retrieval. Likewise, when a plurality of placement devices 86 are provided, a part of the placement devices 86 may be used as the placement device(s) for storage, and another part of the placement devices 86 may be used as the placement device(s) for retrieval.

2. Configuration of Storage Device

Figure 2:
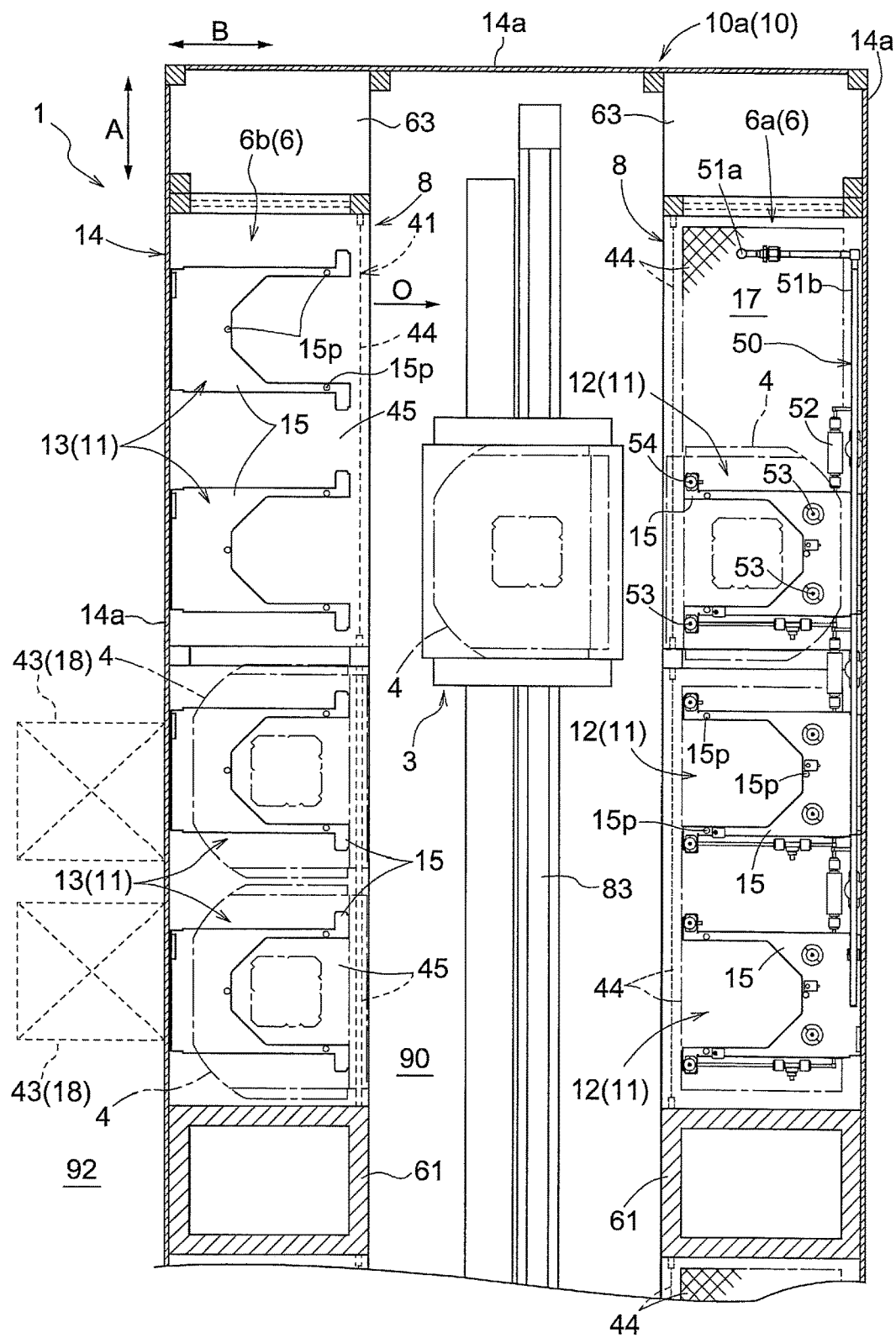
FIG. 2 is a partial cross-sectional view of a storage device according to an embodiment of the present invention.
Figure 3:
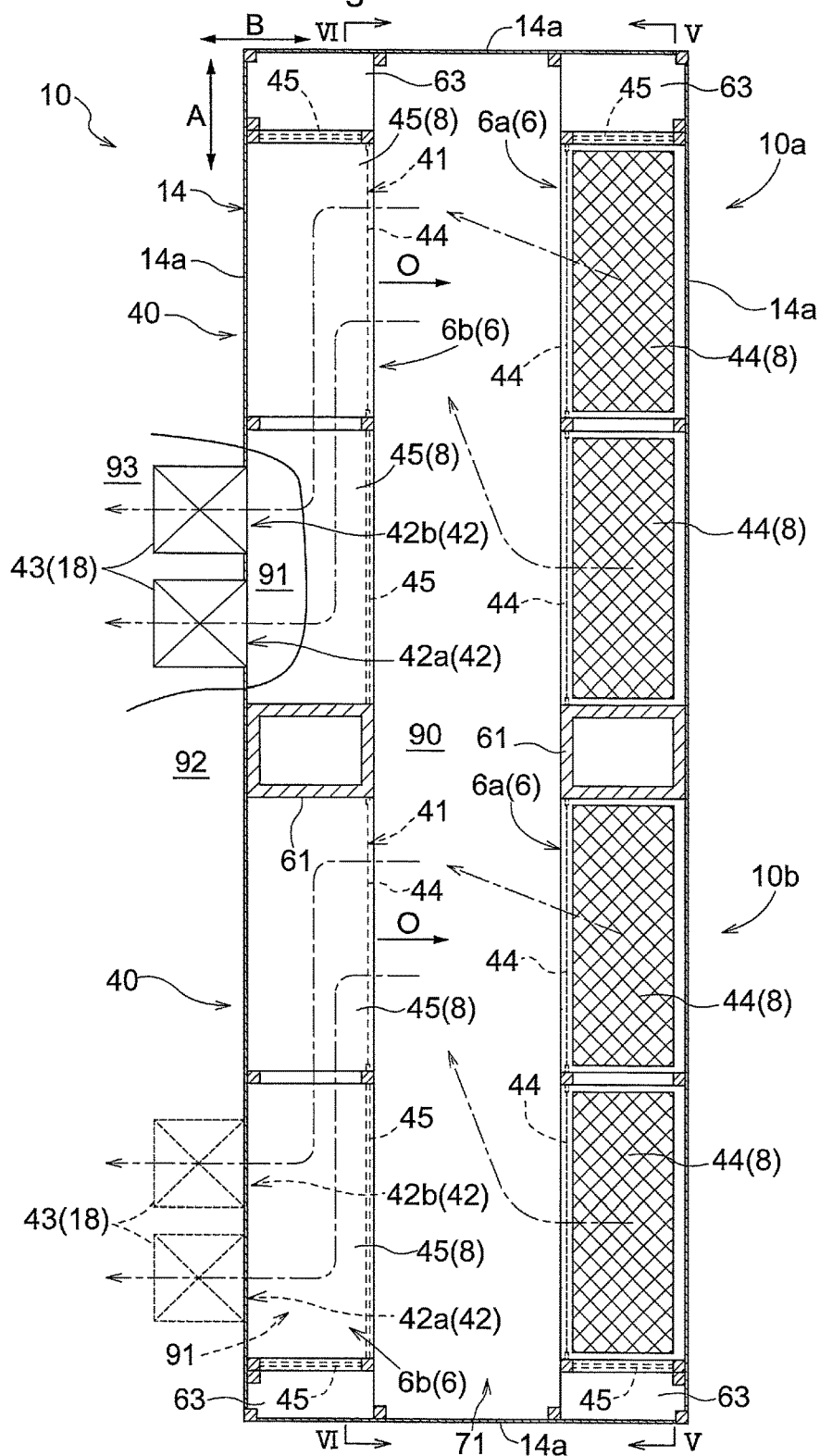
FIG. 3 is a cross-sectional view of the storage device according to an embodiment of the present invention.

As shown in FIG. 1, the storage device 10 includes storage racks 6 in each of which a plurality of storage sections 11 are arranged regularly. In the present embodiment, the storage device 10 further includes an internal transport device 3 that transports the containers 4 in the inside of the storage device 10. The plurality of storage sections 11 provided in each storage rack 6 are arranged along an arrangement direction A as shown in FIG. 2. Here, the arrangement direction A is a direction along a horizontal plane. Assuming that a direction that is along a horizontal plane and is orthogonal to the arrangement direction A is an arrangement orthogonal direction B, an opening direction O, which will be described below, is set to be a direction parallel to the arrangement orthogonal direction B as shown in FIGS. 2 and 3 in the present embodiment. In the present embodiment, as shown in FIG. 1, the plurality of storage sections 11 provided in each storage rack 6 are arranged also in the up-down direction V (the vertical direction), in addition to the arrangement direction A.

As shown in FIG. 2, the traveling path of the internal transport device 3 is formed so as to extend along the arrangement direction A. Regarding each storage rack 6, if it is assumed that the side on which the containers 4 are placed in or taken out from the storage sections 11 is the rack front side, the storage rack 6 is fixed to the floor portion 88 such that the rack front side coincides with the traveling path side of the internal transport device 3 (i.e., the movement space side of the internal transport device 3). In the present embodiment, the storage rack 6 is fixed to the lower floor 82 in a state in which the bottom portion 7 of the storage rack 6 is supported by the lower floor 82 via struts 9 as shown in FIG. 1. In other words, in the present embodiment, the bottom portion 7 of the storage rack 6 is disposed at a position spaced apart upward from the lower floor 82, and a gap extending along a horizontal plane is formed between the bottom portion 7 and the lower floor 82.

In the present embodiment, the internal transport device 3 is a stacker crane, and includes a traveling member 3a that travels/moves along the rail 83 provided on the floor portion 88, a mast 3b provided upright on the traveling member 3a, and an elevating member 3c that moves up and down while being guided by the mast 3b. In the present embodiment, the rail 83 is provided on the lower floor 82. The elevating member 3c includes a transfer device 3d for transferring the container 4 between the elevating member 3c and the storage section 11. In the present embodiment, the transfer device 3d is configured to be able to move the container 4 also between the elevating member 3c and the moving device 84, and between the elevating member 3c and the placement device 86. Although the detailed description is omitted, the transfer device 3d according to the present embodiment includes a placement support member for placing and supporting the container 4 such that the placement support member is movable between a protruding position to protrude to the storage section 11 side and a retracted position to retract to the elevating member 3c side. Also, the stacker crane performs a scoop process in which the placement support member located at the protruding position is moved up, thereby scooping up the container 4 from the storage section 11 and placing it on the placement support member, and a put-down process in which the placement support member located at the protruding position is moved down, thereby putting down the container 4 placed on the placement support member to the storage section 11.

As shown in FIG. 2, each storage section 11 includes a placement support portion 15 on which the container 4 is placed and supported. The placement support portion 15 is formed in a U-shape when viewed in the up-down direction to form a space through which the above-described placement support member of the transfer device 3d passes in the up-down direction V. The placement support portion 15 includes a plurality of (in the present example, three) positioning protruding portions 15p, and the protruding portions 15p are formed so as to protrude upward from the top surface of the placement support portion 15. Although not shown, a plurality of (in the present example, three) engaging portions (e.g., engaging grooves) with which the protruding portions 15p engage are formed at the bottom surface of the container 4, and the container 4 is positioned with respect to the placement support portion 15 in a state in which the protruding portions 15p and the engaging portions of the container 4 engage with each other.

In the present embodiment, the storage device 10 includes a plurality of storage racks 6. Specifically, as shown in FIGS. 1 and 2, the storage device 10 includes a first storage rack 6a and a second storage rack 6b that are disposed so as to be opposed to each other in the arrangement orthogonal direction B across the traveling path of the internal transport device 3. In other words, a movement space of the internal transport device 3 is formed between the first storage rack 6a and the second storage rack 6b. In the present embodiment, the first storage rack 6a and the second storage rack 6b have a width that is set to be equal in the arrangement direction A, and have a width that is set to be equal in the arrangement orthogonal direction B. Also, the first storage rack 6a and the second storage rack 6b that are opposed to each other in the arrangement orthogonal direction B are disposed at the same position in the arrangement direction A. In the present embodiment, as shown in FIG. 1, the first storage rack 6a is disposed along an inner wall of the clean room, and the second storage rack 6b is disposed on the side opposite to that inner wall with respect to the first storage rack 6a. Also, the moving device 84 for the external transport device 2 and the placement device 86 for the operator described above are provided in place of the storage sections 11 in the second storage rack 6b as shown in FIG. 4.

Figure 5:
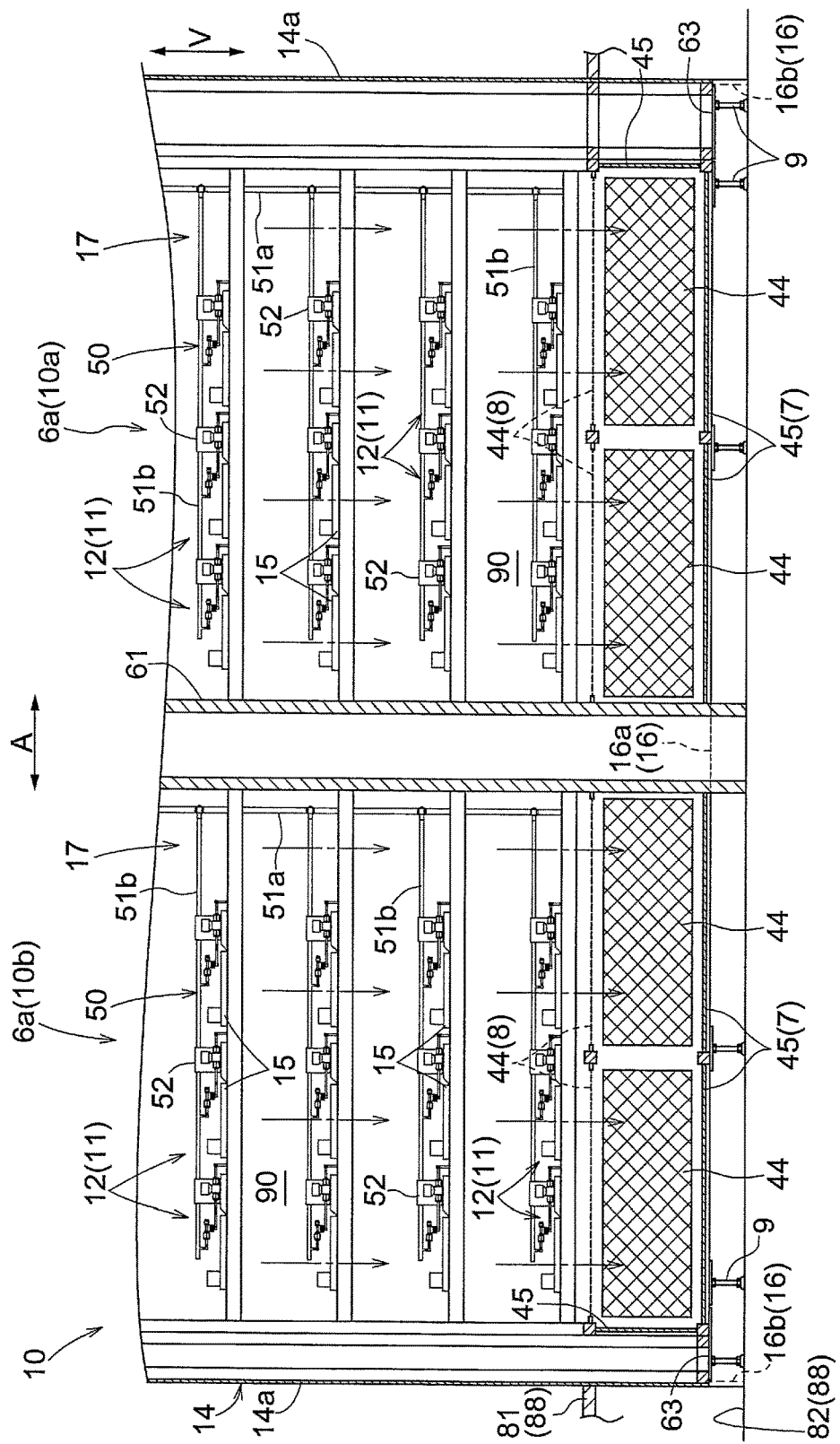
FIG. 5 is a cross-sectional view taken along the arrows V-V in FIG. 3.

In the present embodiment, as shown in FIGS. 3 to 5, two first storage racks 6a are arranged in the arrangement direction A, and two second storage racks 6b are arranged in the arrangement direction A. In the present embodiment, the two first storage racks 6a are disposed so as to be spaced apart from each other in the arrangement direction A, and the two second storage racks 6b are disposed so as to be spaced apart from each other in the arrangement direction A. Assuming that a unit of components including a first storage rack 6a and a second storage rack 6b that are disposed so as to be opposed to each other in the arrangement orthogonal direction B is a storage portion, the storage device 10 of the present embodiment includes a first storage portion 10a and a second storage portion 10b that are arranged in the arrangement direction A as shown in FIGS. 2 to 5. Although the first storage portion 10a and the second storage portion 10b are basically configured in the same manner, the first storage portion 10a and the second storage portion 10b in the present embodiment are different in configuration as shown in FIG. 4 in that the position at which the moving device 84 is provided in the second storage rack 6b (the position at which it is provided in the arrangement direction A) is different, and that the placement devices 86 are provided only in the second storage rack 6b of the first storage portion 10a.

The plurality of storage sections 11 of the storage device 10 are disposed in the inside of the storage space 90 that is formed so as to be partitioned from the outside. In the present embodiment, the cross-sectional shape of the storage space 90 that is orthogonal to the up-down direction V is formed uniformly along the up-down direction V. Also, in the present embodiment, the cross-sectional shape is formed in a rectangular shape having two sides that are parallel to the arrangement direction A and two sides that are parallel to the arrangement orthogonal direction B as shown in FIG. 3. In other words, in the present embodiment, the storage space 90 is formed as a rectangular parallelepiped-shaped space. In the present embodiment, the plurality of storage sections 11 are provided in the storage rack 6, and the storage device 10 includes a plurality of storage racks 6 (specifically, two first storage racks 6a and two second storage racks 6b). The plurality of storage racks 6 are disposed in the inside of the same storage space 90 as shown in FIG. 3.

The storage device 10 includes a wall member 14 for partitioning a storage space 90. In the present embodiment, the wall member 14 includes a peripheral wall portion 14a that surrounds the periphery of the plurality of storage racks 6 when viewed in the up-down direction V as shown in FIG. 3. The peripheral wall portion 14a is formed in a tubular shape extending along the up-down direction V, and the cross-sectional shape of the peripheral wall portion 14a that is orthogonal to the up-down direction V is formed in a rectangular shape having two sides that are parallel to the arrangement direction A and two sides that are parallel to the arrangement orthogonal direction B. As shown in FIG. 3, the width of the peripheral wall portion 14a in the arrangement direction A is set to be larger than the region in the arrangement direction A that is occupied by the two storage racks 6 arranged in the arrangement direction A. Also, each of the storage racks 6 is disposed at a position that is spaced apart from the peripheral wall portion 14a in the arrangement direction A such that a gap in the arrangement direction A is formed between the peripheral wall portion 14a and the storage rack 6. Additionally, the width of the peripheral wall portion 14a in the arrangement orthogonal direction B is set in conformity with the range in the arrangement orthogonal direction B that is occupied by the first storage rack 6a and the second storage rack 6b that are opposed to each other across the movement space of the internal transport device 3. Accordingly, each of the storage racks 6 is disposed such that the rack rear side (the side opposite to the rack front side) thereof is along the inner surface of the peripheral wall portion 14a. Note that it is also possible to adopt a configuration in which the width of the peripheral wall portion 14a in the arrangement orthogonal direction B is set to be larger than the region in the arrangement orthogonal direction B that is occupied by the first storage rack 6a and the second storage rack 6b that are opposed to each other across the movement space of the internal transport device 3, and the storage rack 6 is disposed at a position that is spaced apart from the peripheral wall portion 14a in the arrangement orthogonal direction B such that a gap in the arrangement orthogonal direction B is formed between the peripheral wall portion 14a and the storage rack 6.

As shown in FIG. 1, an opening portion 70 for providing each moving device 84 is formed in the peripheral wall portion 14a, and the above-described operator opening portion is formed in the location where the placement devices 86 are provided (see FIG. 4). Also, external communicating portions 42 (see FIGS. 1 and 3), the details of which will be described below, are formed in the peripheral wall portion 14a. The peripheral wall portion 14a is configured to partition the inside and the outside of the storage space 90 from each other such that gas cannot flow in the horizontal direction except for the locations where the opening portions 70, the operator opening portion, and the external communicating portions 42 are formed. Note that, basically, the operator opening portion is air-tightly closed in the present embodiment as described above. On the other hand, the opening portions 70 are constantly open in the present embodiment. It is also possible to adopt a configuration in which an opening/closing member for opening/closing each opening portion 70 is provided and the opening portion 70 is open only when the moving device 84 is used.

In the present embodiment, the storage device 10 includes a blower device 85 that blows air downward from above the storage space 90 as shown in FIG. 1. The blower device 85 sucks the air in the outside of the storage space 90 and supplies the air to the inside of the storage space 90. The blower device 85 is provided so as to close a rectangular opening portion that is formed in the upper end of the peripheral wall portion 14a. Due to the ventilation action of the blower device 85, a downward gas flow is formed in the inside of the storage space 90. In the present embodiment, the blower device 85 is composed of a fan filter unit. In the present example, a plurality of fan filter units are arranged so as to close the upper opening portion of the peripheral wall portion 14a. Note that each fan filter unit is a blower unit composed of a blower fan and a dust filter that are assembled integrally. The air supplied to the inside of the storage space 90 by the blower device 85 is the air obtained by cleaning the air within the clean room by using the fan filter units (dust filters).

As shown in FIG. 1, the bottom portion 7 of each storage rack 6 is disposed at the same position in the up-down direction V as the lower end of the peripheral wall portion 14a. Also, the bottom portion 7 is composed of non-permeable, non-porous plates 45 as shown in FIGS. 4 and 5. Specifically, the bottom portion 7 is composed of two non-porous plates 45 arranged in the arrangement direction A with surfaces thereof oriented along a horizontal plane. Accordingly, the flow of gas in the up-down direction V via the bottom portion 7 is limited at the opening portion formed in the lower end of the peripheral wall portion 14a.

As shown in FIGS. 2 to 5, in a gap region in the arrangement direction A between each storage rack 6 and the peripheral wall portion 14a at the lower opening portion of the peripheral wall portion 14a, a plate-shaped member 63 that limits the flow of gas in the up-down direction V in the gap region is provided. The plate-shaped member 63 is a non-permeable, non-porous plate whose surface is disposed in an orientation along a horizontal plane, and disposed at the same position in the up-down direction V as the bottom portion 7. Also, the shape of the plate-shaped member 63 when viewed in the up-down direction is formed in a rectangular shape in conformity with the above-described gap region. That is, the plate-shaped member 63 has a width that is set to be equal to that of the gap region in the arrangement direction A, and has a width that is set to be equal to that of the bottom portion 7 in the arrangement orthogonal direction B.

Furthermore, as shown in FIGS. 3 to 5, a tubular member 61 extending in the up-down direction V is provided in an inter-rack region between the storage racks 6 that are adjacent to each other in the arrangement direction A. The tubular member 61 includes a non-permeable, tubular wall portion, and the cross-sectional shape of the tubular member 61 that is orthogonal to the up-down direction V is formed in a rectangular shape in conformity with the inter-rack region as shown in FIG. 3. In other words, the tubular member 61 has a width that is set to be equal to that of the inter-rack region in the arrangement direction A, and has a width that is set to be equal to that of the bottom portion 7 in the arrangement orthogonal direction B. Also, the upper end of the tubular member 61 is disposed as the same position in the up-down direction V as the upper end of the peripheral wall portion 14a. The lower end of the tubular member 61 is disposed at the same position in the up-down direction V as the lower end of the peripheral wall portion 14a, or disposed below the lower end of the peripheral wall portion 14a. In the present embodiment, as shown in FIGS. 4 and 5, the lower end of the tubular member 61 is disposed below the lower end of the peripheral wall portion 14a, and more specifically, disposed on the lower floor 82.

Due to the configuration described above, the flow of gas in the up-down direction V is permitted only in the rectangular region formed at the central part of the lower opening portion of the peripheral wall portion 14a in the arrangement orthogonal direction B, more specifically, only in the rectangular region formed between the bottom portion 7 of the first storage rack 6a and the bottom portion 7 of the second storage rack 6b in the arrangement orthogonal direction B. In other words, in the present embodiment, the lower opening portion of the peripheral wall portion 14a is not closed, and a flow opening portion 71 through which gas can flow in the up-down direction V is formed by the rectangular region (see FIGS. 1 and 3). Also, the storage device 10 is provided with a limiting portion 16 in order to limit the outflow of the gas that has flowed downward through the flow opening portion 71 to the outside of the storage device 10.

As shown in FIGS. 1, 4, and 5, the limiting portion 16 has the same height as the height of the gap between the flow opening portion 71 and the floor surface (in the present example, the gap between the bottom portion 7 and the lower floor 82). Additionally, the limiting portion 16 is provided along an edge of the flow opening portion 71 when viewed in the up-down direction. Specifically, in the present embodiment, the flow opening portion 71 is a rectangular opening portion, and the limiting portion 16 includes two first extension portions 16a extending parallel in the arrangement direction A, and two second extension portions 16b extending in the arrangement orthogonal direction B. On either side in the arrangement direction A, ends of the two first extension portions 16a are connected to each other by one second extension portion 16b.

Specifically, as shown in FIGS. 4 and 5, the length of each first extension portion 16a in the arrangement direction A is set to be equal to the width of the peripheral wall portion 14a in the arrangement direction A. Also, as shown in FIG. 1, one of the first extension portions 16a is disposed at the same position in the arrangement orthogonal direction B as the end of the bottom portion 7 of the first storage rack 6a on the rack front side, and the other first extension portion 16a is disposed at the same position in the arrangement orthogonal direction B as the end of the bottom portion 7 of the second storage rack 6b on the rack front side. As shown in FIGS. 4 and 5, one of the second extension portions 16b is disposed at the same position in the arrangement direction A as an end of the peripheral wall portion 14a on one side in arrangement direction A, and the other second extension portion 16b is disposed at the same position in the arrangement direction A as an end of the peripheral wall portion 14a on the other side in the arrangement direction A.

3. Configuration of Inactive Gas Supply Portion

The inactive gas supply portion 50 supplies inactive gas to the inside of the container 4 stored in the storage section 11. Here, inactive gas is gas that has low reactivity with the content contained in the container 4 (gas that produces substantially no problematic chemical reaction). In the present embodiment, nitrogen gas is used as the inactive gas. Note that noble gas such as argon gas or krypton gas may be used as the inactive gas.

In the present embodiment, the inactive gas supply portion 50 is configured to supply inactive gas to the inside of the container 4 stored in a target storage section 12 included in the plurality of storage sections 11. That is, in the present embodiment, the plurality of storage sections 11 included in the storage device 10 are divided into target storage sections 12, and non-target storage sections 13 other than the target storage sections 12. In the present embodiment, as shown in FIG. 1, the plurality of storage sections 11 included in the first storage rack 6a are the target storage sections 12, and the plurality of storage sections 11 included in the second storage rack 6b are the non-target storage sections 13.

As shown in FIG. 2, the placement support portion 15 included in each target storage section 12 includes gas supply portions 53 for supplying the inactive gas to the inside of the container 4, and a gas exhaust portion 54 for discharging gas from the inside of the container 4. In the present embodiment, the placement support portion 15 includes three gas supply portions 53 and one gas exhaust portion 54. Each of the gas supply portions 53 includes a discharge nozzle. The gas exhaust portion 54 includes an exhaust pipe whose end is open in the inside of the storage space 90, and is configured to discharge the gas within the container 4 to the inside of the storage space 90. Although not shown, supply ports and an exhaust port are provided in the bottom portion of each container 4, and the gas supply portions 53 are in communication with the supply ports of the container 4 and the gas exhaust portion 54 is in communication with the exhaust port of the container 4 in a state in which the container 4 is placed and supported by the placement support portion 15. In this state, the inactive gas supply portion 50 supplies the inactive gas to the inside of the container 4 via the gas supply portions 53, while discharging the gas within the container 4 to the outside of the container 4 via the gas exhaust portion 54. Thereby, the gas within the container 4 is replaced with the inactive gas. Note that each of the supply ports and the exhaust port of the container 4 is provided with an open/close valve that is biased to the valve-closed side and is opened by the gas pressure when the inactive gas is supplied by the inactive gas supply portion 50.

The inactive gas supply portion 50 includes a first pipe 51a connected to a supply source (e.g., a gas cylinder or the like) of the inactive gas and second pipes 51b that connect the first pipe 51a to the gas supply portions 53. As shown in FIGS. 1, 2, and 5, the first pipe 51a is provided so as to extend in the up-down direction V, and the second pipes 51b are provided so as to branch from the first pipe 51a and extend in the horizontal direction. The same numbers of the second pipes 51b as the number of the target storage sections 12 arranged in the up-down direction V are provided, and the plurality of the second pipes 51b are disposed separately at positions respectively corresponding to the plurality of target storage sections 12 in the up-down direction V.

As shown in FIGS. 2 and 5, the first pipe 51a is provided so as to extend in the up-down direction V inside a piping space 17 formed in each first storage rack 6a. In the present embodiment, the piping space 17 is formed by not utilizing a partial region (in the present example, an end region) of the first storage rack 6a in the arrangement direction A at any position in the up-down direction V as the target storage section 12. In other words, in the present embodiment, the piping space 17 is formed as a space that is continuous in the up-down direction V in an end region of the first storage rack 6a in the arrangement direction A (the region having the same width in the arrangement direction A as the target storage section 12). Accordingly, as shown in FIG. 2, the number of the storage sections 11 of each first storage rack 6a arranged in the arrangement direction A (in the present example, three) is fewer by one than the number of the storage sections 11 of each second storage rack 6b arranged in the arrangement direction A. In other words, a plurality of the target storage sections 12 are disposed along the arrangement direction A in each first storage rack 6a, and three target storage sections 12 are disposed along the arrangement direction A in the present embodiment.

As shown in FIGS. 2 and 5, each of the second pipes 51b is connected via a flow rate adjustment device 52 to the gas supply portions 53 of one of the target storage sections 12 (in the present example, three target storage sections 12) to which gas is to be supplied. Each flow rate adjustment device 52 is a device that adjusts the supply flow rate of the inactive gas supplied to the gas supply portion 53 side, and is provided separately to each of the plurality of the target storage sections 12. The flow rate adjustment device 52 adjusts the supply flow rate to a target flow rate that is instructed from a flow rate controller. The flow rate controller instructs the target flow rate to the flow rate adjustment device 52 in accordance with a supply pattern in which the target flow rate and the supply period are defined.

When the inactive gas is supplied to the inside of the container 4 stored in the target storage section 12, a storage supply pattern is used as the supply pattern. The storage supply pattern is, for example, a pattern in which the target flow rate is set to a first flow rate for a set time period from the completion of storing of the container 4 in the target storage section 12 and the target flow rate is set to a second flow rate that is smaller than the first flow rate after an elapse of the set time period. Note that it is possible to adopt a pattern in which the inactive gas is intermittently supplied after an elapse of the set time period. When the inactive gas is supplied to the inside of the container 4 in accordance with the storage supply pattern in this way, the gas within the container 4 that contains the inactive gas supplied by the inactive gas supply portion 50 is discharged to the inside of the storage space 90 via the gas exhaust portion 54 of the placement support portion 15. In the present embodiment, although the container 4 is capable of air-tightly sealing the inside space, the internal pressure of the container 4 is increased during supply of the inactive gas, thereby discharging the gas within the container 4 that contains the inactive gas supplied by the inactive gas supply portion 50 to the inside of the storage space 90 via the gap between the body portion and the cover portion.

In the present embodiment, a nozzle cleaning supply pattern and a line cleaning supply pattern are provided as the supply pattern, in addition to above-described storage supply pattern. The nozzle cleaning supply pattern is used when the discharge nozzle of each gas supply portion 53 is cleaned for the target storage section 12 into which the container 4 is stored within a predetermined time period. The line cleaning supply pattern is used when the pipe between the flow rate adjustment device 52 and the gas supply portion 53 is also cleaned in addition to the discharge nozzle of the gas supply portion 53 during, for example, the installation of the storage device 10. When the nozzle cleaning supply pattern or the line cleaning supply pattern is used, the container 4 is not supported by the placement support portion 15. Accordingly, the inactive gas supplied by the inactive gas supply portion 50 to the gas supply portion 53 of the placement support portion 15 is directly discharged to the inside of the storage space 90.

4. Configuration of Gas Discharge Portion

As described above, when the inactive gas supply portion 50 supplies the inactive gas to the inside of the container 4 stored in the target storage section 12, the gas within the container 4 that contains the inactive gas supplied by the inactive gas supply portion 50 is discharged to the inside of the storage space 90. Then, the gas within the storage space 90 that contains the gas discharged from the container 4 in this way is discharged to the outside of the storage space 90 by a gas discharge portion 40 included in the storage device 10.

As shown in FIGS. 1 and 4, the gas discharge portion 40 includes a restricting orifice portion 41 formed below the region where the storage sections 11 are disposed. The restricting orifice portion 41 serves as a restricting portion that restricts the flow rate of gas. In the present embodiment, as shown in FIG. 1, a partitioning portion 8 is provided between the storage section 11 that is disposed lowermost of the plurality of storage sections 11 arranged in the up-down direction V and the bottom portion 7, and the restricting orifice portion 41 is formed between the partitioning portion 8 and the bottom portion 7 in the up-down direction V. The region where the storage sections 11 are disposed is formed above the partitioning portion 8 in the storage space 90, and a lower space in which no storage section 11 is disposed is formed below the partitioning portion 8 in the storage space 90.

As shown in FIGS. 1, 4, and 5, in the present embodiment, the partitioning portion 8 has a width that is set to be equal to that of the bottom portion 7 in the arrangement direction A, and has a width that is set to be equal to that of the bottom portion 7 in the arrangement orthogonal direction B. Also, as shown in FIGS. 3 to 5, one side of the space in the arrangement direction A that is formed between the bottom portion 7 and the partitioning portion 8 included in the same storage rack 6 is partitioned by the tubular member 61 such that gas cannot flow in the arrangement direction A. The other side of the space in the arrangement direction A is partitioned by a non-porous plate 45 such that gas cannot flow in the arrangement direction A. The non-porous plate 45 is provided so as to connect the ends of the bottom portion 7 and the partitioning portion 8 on the same side in the arrangement direction A to each other. Also, the non-porous plate 45 is disposed in an orientation such that its surface is oriented along a plane orthogonal to the arrangement direction A, and the non-porous plate 45 has a width that is set to be equal to that of each of the bottom portion 7 and the partitioning portion 8 in the arrangement orthogonal direction B.

As shown in FIGS. 3 and 5, in the present embodiment, the partitioning portion 8 of each first storage rack 6a is composed of porous plates 44. Here, a porous plate 44 is a plate-like member in which a plurality of ventilation holes extending therethrough in the thickness direction are formed, and a mesh plate (net plate), a punched plate or the like can be used, for example. Specifically, the partitioning portion 8 of the first storage rack 6a is composed of two porous plates 44 arranged in the arrangement direction A with surfaces thereof oriented along a horizontal plane. Thereby, the area above the space formed between the bottom portion 7 and the partitioning portion 8 in the first storage rack 6a is partitioned such that gas can flow in the up-down direction V. The area below the space formed between the bottom portion 7 and the partitioning portion 8 in the first storage rack 6a is partitioned by the bottom portion 7 such that gas cannot flow in the up-down direction V.

As shown in FIG. 5, two porous plates 44 whose surfaces are oriented along a plane orthogonal to the arrangement orthogonal direction B are arranged in the arrangement direction A so as to connect the ends of the partitioning portion 8 and the bottom portion 7 of the first storage rack 6a on the rack front side to each other. Thereby, the rack front side of the space formed between the bottom portion 7 and the partitioning portion 8 in the first storage rack 6a is partitioned such that gas can flow in the arrangement orthogonal direction B. The rack rear side of the space formed between the bottom portion 7 and the partitioning portion 8 in the first storage rack 6a is partitioned by the peripheral wall portion 14a such that gas cannot flow in the arrangement orthogonal direction B.

On the other hand, as shown in FIGS. 3 and 4, in the present embodiment, the partitioning portion 8 of each second storage rack 6b is composed of non-porous plates 45. Specifically, the partitioning portion 8 of the second storage rack 6b is composed of two non-porous plates 45 arranged in the arrangement direction A with surfaces thereof oriented along a horizontal plane. Thereby, the area above the space formed between the bottom portion 7 and the partitioning portion 8 in the second storage rack 6b is partitioned such that gas cannot flow in the up-down direction V. The area below the space formed between the bottom portion 7 and the partitioning portion 8 in the second storage rack 6b is partitioned by the bottom portion 7 such that cannot flow in the up-down direction V.

A non-porous plate 45 whose surface is oriented along a plane orthogonal to the arrangement orthogonal direction B is provided so as to connect the ends of the partitioning portion 8 and the bottom portion 7 in the second storage rack 6b on the rack front side to each other. The non-porous plate 45 is provided so as to connect the ends of the partitioning portion 8 and the bottom portion 7 on the rack front side to each other only in a partial region in the arrangement direction A, and an opening portion serving as the restricting orifice portion 41 is formed in the portion where the non-porous plate 45 is not provided. In the present embodiment, a porous plate 44 whose surface is oriented along a plane orthogonal to the arrangement orthogonal direction B is provided in the restricting orifice portion 41. Accordingly, the rack front side of the space formed between the bottom portion 7 and the partitioning portion 8 in the second storage rack 6b is partitioned such that gas cannot flow in the arrangement orthogonal direction B in the region where the non-porous plate 45 is disposed, and is partitioned such that gas can flow in the arrangement orthogonal direction B in the region where the restricting orifice portion 41 is disposed. The rack rear side of the space formed between the bottom portion 7 and the partitioning portion 8 in the second storage rack 6b is partitioned by the peripheral wall portion 14a such that gas cannot flow in the arrangement orthogonal direction B except for the location where an external communicating portion 42, which will be described below, is formed.

In the present embodiment, the opening direction O of the restricting orifice portion 41 is set to a direction parallel to the arrangement orthogonal direction B. In the present embodiment, the width of the restricting orifice portion 41 in the up-down direction V is set to be equal to the interval between the bottom portion 7 and the partitioning portion 8 in the up-down direction V. Furthermore, in the present embodiment, the width of the restricting orifice portion 41 in the arrangement direction A is set to be narrower than the width of the second storage rack 6b in the arrangement direction A by the width, in the arrangement direction A, of the non-porous plate 45 that connects the ends of the partitioning portion 8 and the bottom portion 7 on the rack front side to each other. Thereby, the restricting orifice portion 41 serves as the restricting portion that restricts the flow rate of gas. In the present embodiment, the non-porous plate 45 is disposed in a region in the arrangement direction A that includes the end on one side (the lower side in FIG. 3, and the right side in FIG. 4) in the arrangement direction A, and the restricting orifice portion 41 is formed in a region in the arrangement direction A that includes the end on the other side (the upper side in FIG. 3, and the left side in FIG. 4) in the arrangement direction A. Furthermore, in the present embodiment, the width of the non-porous plate 45 in the arrangement direction A is set to be half the width of the second storage rack 6b in the arrangement direction A, and the width of the restricting orifice portion 41 in the arrangement direction A is half the width of the second storage rack 6b in the arrangement direction A.

In the present embodiment, at least a part of the restricting orifice portion 41 is disposed at a different position in the arrangement direction A from the target storage sections 12.

Note that in the present specification, two portions "differ in position in a certain direction" means that the regions where the two portions are respectively disposed in that direction do not have parts overlapping each other. In the present embodiment, as shown in FIG. 2, the part on one side (the upper side in FIG. 2) of the restricting orifice portion 41 in the arrangement direction A is disposed at a different position in the arrangement direction A from the target storage section 12, and the part on the other side (the lower side in FIG. 2) of the restricting orifice portion 41 in the arrangement direction A is disposed at the same position in the arrangement direction A as the target storage section 12. In other words, in the present embodiment, the restricting orifice portion 41 and the target storage section 12 are disposed such that the regions where they are disposed overlap each other in the arrangement direction A.

Specifically, in the present embodiment, in order to form the piping space 17 at an end portion on one side in the arrangement direction A, three target storage sections 12 are disposed toward the other side in the arrangement direction A with respect to the piping space 17 as shown in FIG. 2. The restricting orifice portion 41 is formed in the range of the arrangement direction A that is occupied by each piping space 17 and one target storage section 12 adjacent to the piping space 17 (in the present embodiment, the range corresponding to a half of the width of the second storage rack 6b in the arrangement direction A). Accordingly, the part of the restricting orifice portion 41 on one side in the arrangement direction A with respect to the central part is disposed at the same position in the arrangement direction A as the piping space 17, and the part of the restricting orifice portion 41 on the other side in the arrangement direction A is disposed at the same position in the arrangement direction A as the target storage section 12. Thus, in the present embodiment, the region where the restricting orifice portion 41 is disposed in the arrangement direction A and the region where the plurality of (in the present example, three) target storage sections 12 are disposed in the arrangement direction A are formed so as to be shifted from each other in the arrangement direction A such that portions of these regions overlap each other.

In the present embodiment, the flow opening portion 71 is formed in the lower opening portion of the peripheral wall portion 14a as described above. However, the outflow of the gas that has flowed downward through the flow opening portion 71 to the outside of the storage space 90 is limited by the limiting portion 16. That is, the limiting portion 16 limits, below the region where the storage sections 11 are disposed, the discharge of gas that does not pass through the gas discharge portion 40 to the outside of the storage space 90. Accordingly, in the present embodiment, the lower space that is formed below the partitioning portion 8 in the storage space 90 is formed so as to be able to discharge the gas that has flowed in from above (i.e., from the side of the region where the storage sections 11 are disposed) to the outside of the storage space 90 only through the gas discharge portion 40. In other words, the gas that has flowed into the lower space from above will not be discharged to the outside of the storage space 90 unless the gas flows through the restricting orifice portion 41. Here, since the restricting orifice portion 41 serves as the restricting portion that restricts the flow rate of gas, the mixing of gases in the inside of the storage space 90 is promoted in the inside of the storage space 90 to the extent that the flow rate is restricted by the restricting orifice portion 41. This makes it possible to appropriately mix the inactive gas supplied by the inactive gas supply portion 50 with the gas within the storage space 90 by the time at which the gas is discharged to the outside of the storage space 90, thereby suppressing the inactive gas concentration in the gas discharged by the gas discharge portion 40.

In the present embodiment, in order to further suppress the concentration of the inactive gas contained in the gas discharged by the gas discharge portion 40, the gas discharge portion 40 is configured to discharge the gas that has passed through the restricting orifice portion 41 to the outside of the storage space 90 via a communicating space 91 and an external communicating portion 42. Here, the communicating space 91 is a space formed below the region where the storage sections 11 are disposed in the inside of the storage space 90, and is in communication, via the restricting orifice portion 41, with the region where the storage sections 11 are disposed. In the present embodiment, the communicating space 91 is formed by the space formed between the bottom portion 7 and the partitioning portion 8 in each second storage rack 6b. In the present embodiment, the communicating space 91 is in communication with the region where the storage sections 11 are disposed, via the restricting orifice portion 41 and a part of the storage space 90 on the rack front side of the communicating space 91.

As shown in FIGS. 1, 3, and 4, the gas discharge portion 40 includes an external communicating portion 42 that communicates the communicating space 91 with the outside of the storage space 90. The part of the communicating space 91 other than the restricting orifice portion 41 and the external communicating portion 42 is partitioned such that gas cannot flow. Also, the gas discharge portion 40 discharges the gas that has been introduced into the communicating space 91 via the restricting orifice portion 41 to the outside of the storage space 90 via the external communicating portion 42. As with the restricting orifice portion 41, the width of the external communicating portion 42 in the arrangement direction A is set to be narrower than the width of the second storage rack 6b in the arrangement direction A, and serves as the restricting portion that restricts the flow rate of gas. In the present embodiment, the width of the external communicating portion 42 in the arrangement direction A is set to be smaller than a half of the width of the second storage rack 6b in the arrangement direction A. Accordingly, the mixing of gases can also be promoted in the communicating space 91, and as a result, it is possible to suppress the inactive gas concentration in the gas discharged from the external communicating portion 42. To facilitate the understanding of the invention, the external communicating portion 42 disposed on the front side of the plane of paper in FIG. 4 is indicated by the dashed dotted line.

As shown in FIGS. 1 and 3, in the present embodiment, the external communicating portion 42 is constituted by an opening portion that is formed so as to pass through the peripheral wall portion 14a of the wall member 14 in the arrangement orthogonal direction B. Accordingly, the opening direction of the external communicating portion 42 is a direction parallel to the arrangement orthogonal direction B, as with the opening direction O of the restricting orifice portion 41. Also, as shown in FIGS. 3 and 4, in the present embodiment, the restricting orifice portion 41 and the external communicating portion 42 are disposed at different positions relative to each other in a direction (corresponding to the arrangement direction A in the present embodiment) orthogonal to both the up-down direction V and the opening direction O. In other words, the restricting orifice portion 41 and the external communicating portion 42 are disposed such that the regions where they are disposed in the arrangement direction A do not overlap each other. Specifically, the restricting orifice portion 41 is disposed in a region on one side in the arrangement direction A with respect to the central part of the communicating space 91 in the arrangement direction A, and the external communicating portion 42 is disposed in a region on the other side in the arrangement direction A with respect to the central part. Furthermore, in the present embodiment, as shown in FIGS. 1 and 4, the external communicating portion 42 is disposed at the same position in the up-down direction V as the restricting orifice portion 41.

As shown in FIGS. 3 and 4, in the present embodiment, the external communicating portion 42 includes a first external communicating portion 42a and a second external communicating portion 42b that are disposed side by side in the arrangement direction A. The first external communicating portion 42a and the second external communicating portion 42b are formed so as to be spaced apart from each other in the arrangement direction A. The second external communicating portion 42b is located between the first external communicating portion 42a and the restricting orifice portion 41 in the arrangement direction A, and is disposed such that the region where it is disposed in the arrangement direction A does not overlap the region where the restricting orifice portion 41 is disposed in the arrangement direction A. Thus, in the present embodiment, the external communicating portion 42 is constituted by an assembly of a plurality of communicating portions that are formed so as to be spaced apart from each other in the arrangement direction A.

Meanwhile, the space formed above the partitioning portion 8 in the storage space 90 is in communication with the outside of the storage space 90 in the opening portion 70. The space formed above the partitioning portion 8 in the storage space 90 is in communication with the outside of the storage space 90 via the operator opening portion formed in the location where the placement device 86 (see FIG. 4) is provided in a state in which the operator opening portion is open. In the present embodiment, in order to inhibit the gas within the storage space 90 from being discharged to the outside of the storage space 90 via the opening portion 70 or the operator opening portion, the storage device 10 is provided with a discharge promoting portion 18 that promote the discharge of gas by each gas discharge portion 40.

In the present embodiment, the gas discharge portion 40 includes fans 43 that supply air toward the outside of the storage space 90, and the discharge promoting portion 18 is composed of the fans 43. As shown in FIG. 3, each fan 43 is attached to the external communicating portion 42, and is configured to blow the gas that has been sucked into the communicating space 91 via the external communicating portion 42 to the outside of the storage space 90. As described above, in the present embodiment, the external communicating portion 42 includes the first external communicating portion 42a and the second external communicating portion 42b, and the fan 43 is attached to each of the first external communicating portion 42a and the second external communicating portion 42b. In the present embodiment, the fan 43 is provided so as to protrude from the peripheral wall portion 14a to the outside of the storage space 90 in the horizontal direction. In the present embodiment, the air volume of the fan 43 is sized so as to form an air flow in a direction toward the inside of the storage space 90 in the opening portion 70 and the operator opening portion described above.

Meanwhile, in the present embodiment, as shown in FIG. 1, a controller 5 that controls the operation of the storage device 10 is disposed in the communicating space 91. Furthermore, in the present embodiment, a controller 5 is also disposed in the space formed between the bottom portion 7 and the partitioning portion 8 in each first storage rack 6a. In the present embodiment, the storage device 10 is provided, for example, with a transport controller that controls the operation of the internal transport device 3 and a management device that manages the inventory status of the containers 4 in the storage device 10, in addition to the flow rate controller that controls the flow rate adjustment device 52 described above. Also, at least a part of at least one of the flow rate controller, the transport controller, and the management device is disposed as a controller 5 in the communicating space 91, and is disposed as a controller 5 in the space formed between the bottom portion 7 and the partitioning portion 8 in the first storage rack 6a. Note that it is also possible to adopt a configuration in which no controller 5 is disposed in the communicating space 91.

5. Other Embodiments

Finally, other embodiments according to the present invention will be described. Note that the configuration disclosed in each of the following embodiments is applicable in combination with configurations disclosed in the other embodiments as long as no inconsistency arises.

(1) The above embodiment was described taking, as an example, a configuration in which the restricting orifice portion 41 and the external communicating portion 42 are disposed at different positions relative to each other in the arrangement direction A. However, embodiments of the present invention are not limited thereto. For example, a part of the external communicating portion 42 may be disposed at a different position in the arrangement direction A from the restricting orifice portion 41, and the remaining part of the external communicating portion 42 may be disposed at the same position in the arrangement direction A as the restricting orifice portion 41. For example, the second external communicating portion 42b in FIG. 3 may be shifted to the upper side in the drawing and a part or the whole of the region where the second external communicating portion 42b is disposed in the arrangement direction A may be included in the region where the restricting orifice portion 41 is disposed in the arrangement direction A. Alternatively, the external communicating portion 42 may include a third external communicating portion on the side opposite to the first external communicating portion 42a in the arrangement direction A with respect to the second external communicating portion 42b, and a part or the whole of the region where the third external communicating portion is disposed in the arrangement direction A may be included in the region where the restricting orifice portion 41 is disposed in the arrangement direction A. Thus, unlike the above embodiment, the restricting orifice portion 41 and the external communicating portion 42 may be disposed such that the regions where they are disposed in the arrangement direction A overlap each other. Note that the external communicating portion 42 may not include a part that is disposed at a different position in the arrangement direction A from the restricting orifice portion 41, and the region where the external communicating portion 42 is disposed in the arrangement direction A may be included in the region where the restricting orifice portion 41 is disposed in the arrangement direction A.

(2) The above embodiment was described taking, as an example, a configuration in which a part of the restricting orifice portion 41 is disposed at a different position in the arrangement direction A from the target storage section 12. However, embodiments of the present invention are not limited thereto. For example, the whole of the restricting orifice portion 41 may be disposed at a different position in the arrangement direction A from the target storage section 12. For example, in the configuration shown in FIG. 2, the target storage section 12 that is adjacent to the piping space 17 in the arrangement direction A may not be provided, or the region where the restricting orifice portion 41 is disposed in the arrangement direction A may be included in the region where the piping space 17 is disposed in the arrangement direction A. Alternatively, the whole of the restricting orifice portion 41 may be disposed at the same position in the arrangement direction A as the target storage section 12. In other words, the region where the restricting orifice portion 41 is disposed in the arrangement direction A may be included in the region where one target storage section 12 is disposed in the arrangement direction A, or may be included in the region where a plurality of target storage sections 12 disposed side by side are disposed in the arrangement direction A. For example, in the configuration shown in FIG. 2, the non-porous plate 45 and the porous plate 44 (the porous plate 44 provided in the restricting orifice portion 41) that connect the ends of the partitioning portion 8 and the bottom portion 7 in each second storage rack 6b on the rack front side to each other may be switched.

(3) The above embodiment was described, taking, as an example, a case where each restricting orifice portion 41 is constituted by one opening portion. However, embodiments of the present invention are not limited thereto. More specifically, the restricting orifice portion 41 may be constituted by an assembly of plurality of (e.g., two or three) opening portions that are formed so as to be spaced apart from each other in the arrangement direction A.

(4) The above embodiment was described, taking, as an example, a configuration in which the configuration below the region where the storage sections 11 are disposed (the configuration of the space formed between each partitioning portion 8 and each bottom portion 7) is common to the first storage portion 10a and the second storage portion 10b. However, embodiments of the present invention are not limited thereto. For example, the width of the restricting orifice portion 41 in the arrangement direction A in the first storage portion 10a and that in the second storage portion 10b may be set to be different from each other. Alternatively, the orders of arrangement, in the arrangement direction A, of the non-porous plate 45 and the porous plate 44 (the porous plate 44 provided in the restricting orifice portion 41) that connect the ends of the partitioning portion 8 and the bottom portion 7 of each second storage rack 6b on the rack front side to each other may be reversed between the first storage portion 10a and the second storage portion 10b. For example, in the configuration shown in FIG. 3, the positions of the non-porous plate 45 and the porous plate 44 that connect the ends of the partitioning portion 8 and the bottom portion 7 of the second storage rack 6b on the rack front side to each other may be switched only for the second storage portion 10b. Additionally, the storage device 10 may include only one storage portion, or may include three or more storage portions that are disposed side by side in the arrangement direction A.

(5) The above embodiment was described, taking, as an example, a case where the discharge promoting portion 18 is composed of the fans 43 attached to the external communicating portion 42. However, embodiments of the present invention are not limited thereto. For example, the gas discharge portion 40 may include a fan that is attached to the restricting orifice portion 41 and blows air toward the inside of the communicating space 91, and this fan may be used to form the discharge promoting portion 18. Alternatively, the blower device 85 provided above the storage space 90 may be used to form the discharge promoting portion 18. In this case, the air volume of the blower device 85 is sized so as to promote the discharge of gas by the gas discharge portion 40. When a member other than the fans 43 attached to the external communicating portion 42 is used to form the discharge promoting portion 18 in this way, the gas discharge portion 40 may not include the fan 43.

(6) The above embodiment was described, taking, as an example, a configuration in which the rack rear side of the space formed between the bottom portion 7 and the partitioning portion 8 of the first storage rack 6a is partitioned by the peripheral wall portion 14a such that gas cannot flow in the arrangement orthogonal direction B. However, embodiments of the present invention are not limited thereto. For example, an opening portion may be formed in the peripheral wall portion 14a, and the space formed between the bottom portion 7 and the partitioning portion 8 of the first storage rack 6a may be in communication with the outside of the storage space 90 via the opening portion on the rack rear side. Further, this opening portion may function in the same manner as the external communicating portion 42 of the second storage rack 6b, or in other words, the space formed between the bottom portion 7 and the partitioning portion 8 of the first storage rack 6a may be formed in the same manner as the communicating space 91 of the second storage rack 6b. In this case, fans that are equivalent of the fans 43 may be or may not be disposed in this opening portion.

(7) The above embodiment was described, taking, as an example, a configuration in which each storage section 11 included in the first storage rack 6a is the target storage section 12, and each storage section 11 included in the second storage rack 6b is the non-target storage section 13. However, embodiments of the present invention are not limited thereto. More specifically, each storage section 11 included in the first storage rack 6a may be the non-target storage section 13 and each storage section 11 included in the second storage rack 6b may be the target storage section 12. Alternatively, both the storage section 11 included in the first storage rack 6a and the storage section 11 included in the second storage rack 6b may be the target storage sections 12. Note that when the storage section 11 included in the second storage rack 6b is the target storage section 12, the storage device 10 may include only the second storage rack 6b as the storage rack 6.

(8) The above embodiment was described, taking, as an example, a configuration in which the storage device 10 includes the limiting portions 16. However, embodiments of the present invention are not limited thereto. For example, in the case where no gap is formed between the bottom portion 7 and the lower floor 82 or where a gap is formed between the bottom portion 7 and the lower floor 82, but the flow of gas via that gap is substantially negligible, the storage device 10 may not include the limiting portions 16.

(9) The above embodiment was described, taking, as an example, a configuration in which the flow opening portion 71 is provided in the lower opening portion of the peripheral wall portion 14a. However, embodiments of the present invention are not limited thereto. For example, a plate-shaped member that closes the lower opening portion of the peripheral wall portion 14a may be provided, and the rail 83 may be provided on the top surface of the plate-shaped member.

(10) The above embodiment was described, taking, as an example, a case where the blower device 85 is composed of fan filter units. However, embodiments of the present invention are not limited thereto. For example, the blower device 85 may be a device that supplies clean dry air (CDA) to the inside of the storage space 90. Further, the storage device 10 may not include the blower device 85, and the air within the clean room may be flowed via an opening portion, a gap or the like formed in the wall member 14 to the inside of the storage space 90.

(11) The above embodiment was described, taking, as an example, a configuration in which the gas discharge portion 40 includes the external communicating portion 42, separately from the restricting orifice portion 41. However, embodiments of the present invention are not limited thereto. More specifically, the gas discharge portion 40 may not include the external communicating portion 42, and the gas that has passed through the restricting orifice portion 41 may be directly discharged to the outside of the storage space 90. For example, the flow opening portion 71 formed in the lower opening portion of the peripheral wall portion 14a may serve as the restricting orifice portion 41. At this time, the size of the restricting orifice portion 41 may be adjusted by changing, for example, the width of the bottom portion 7 in the arrangement orthogonal direction B. Further, the gap formed between the bottom portion 7 and the lower floor 82 may be utilized to form the opening portion serving as the restricting orifice portion 41.

(12) The above embodiment was described, taking, as an example, a configuration in which the internal transport device 3 is a stacker crane. However, embodiments of the present invention are not limited thereto. For example, the internal transport device 3 may include an elevating member that moves up and down and a transfer device that is supported so as to be movable in the arrangement direction A relative to the elevating member.

(13) With regard to the other configurations as well, the embodiments disclosed herein are in all respects as illustrative, and embodiments of the present invention are not limited thereto. That is, appropriate changes and modifications may be made to the configurations that are not recited in the claims in the present application without departing from the objects of the present invention.

The invention claimed is:
1. A storage facility comprising:
a storage device including a plurality of storage sections in an inside of a storage space formed so as to be partitioned from an outside of the storage space; and
an inactive gas supply portion that supplies inactive gas to an inside of a container stored in the storage section, wherein:
the inactive gas supply portion includes a gas supply portion that supplies inactive gas directly to the inside of the container via at least one discharge nozzle provided in the storage section,
the storage section includes a gas exhaust portion that discharges gas within the container to the inside of the storage space,
the storage device includes: a blower device that supplies gas from an outside of the storage space to the inside of the storage space; and a gas discharge portion that discharges, to the outside of the storage space, gas within the storage space that is a mixture of the gas supplied by the blower device from the outside of the storage space and the gas discharged by the gas exhaust portion from the inside of the container,
the gas discharge portion includes a restricting orifice portion serving as a restricting portion that restricts a flow rate of gas,
the restricting orifice portion is formed below a region where the storage sections are disposed, the storage device further includes: a communicating space below the region where the storage sections are disposed in the inside of the storage space, the communicating space being in communication with said region via the restricting orifice portion; a storage rack in which the plurality of storage sections are arranged; and an internal transport device that transports the container in the inside of the storage space, the gas discharge portion includes an external communicating portion that communicates the communicating space with the outside of the storage space, the storage rack is disposed so that a rack front face is oriented toward a traveling path side of the internal transport device, the communicating space is formed at a position overlapping with the region where the storage sections are disposed when seen from above, the restricting orifice portion is provided on a side of the rack front face relative to the communicating space so that the restricting orifice portion opens toward the traveling path side, the external communicating portion is provided on an opposite side of the rack front face relative to the communicating space, and the restricting orifice portion and the external communicating portion are spaced apart from each other in a horizontal direction orthogonal to a vertical direction and orthogonal to an opening direction of the restricting orifice portion.

2. The storage facility according to claim 1, wherein a controller that controls an operation of the storage device is disposed in the communicating space.

3. The storage facility according to claim 1, wherein the storage device includes a discharge promoting portion that promotes discharge of gas by the gas discharge portion.

4. The storage facility according to claim 3, wherein the gas discharge portion includes a fan that blows air toward the outside of the storage space, and the discharge promoting portion is constituted by the fan.

5. The storage facility according to claim 1, wherein the inactive gas supply portion is configured to supply inactive gas to an inside of a container stored in a target storage section included in the plurality of the storage sections, wherein a plurality of the target storage sections are disposed along an arrangement direction along a horizontal plane, and wherein at least a part of the restricting orifice portion is disposed at a different position in the arrangement direction from the target storage sections.

6. The storage facility according to claim 1, wherein the storage device includes a limiting portion that limits, below the region where the storage sections are disposed, discharge of gas that does not pass through the gas discharge portion to the outside of the storage space.

7. The storage facility according to claim 1, wherein the storage device includes a wall member for partitioning the storage space, and the external communicating portion is formed in a peripheral wall portion extending vertically in the wall member.

8. The storage facility according to claim 1, wherein the gas discharge portion discharges gas in the inside of the storage space to a space outside the storage space, the space communicating with a work space where an operator performs an operation.

9. The storage facility according to claim 8, wherein the storage device is disposed on a floor portion, wherein the floor portion includes:

a lower floor; and an upper floor located at a higher level than a level of the lower floor and has a plurality of ventilation holes formed therein, wherein the work space is formed at a higher level than the level of the upper floor, and wherein the space communicating with the work space is formed between the upper floor and the lower floor.

10. The storage facility according to claim 1, wherein:

the storage device includes a wall member for partitioning the storage space, the external communicating portion is formed in a peripheral wall portion extending vertically in the wall member, the gas discharge portion includes a fan that blows air toward the outside of the storage space, and the fan is attached to the external communicating portion so as to protrude from the peripheral wall portion to the outside of the storage space in a horizontal direction.

* * * * *